United States Patent [19]
Bridges

[11] Patent Number: 6,105,511
[45] Date of Patent: *Aug. 22, 2000

[54] PACKAGING APPARATUS AND METHOD FOR COMPUTER COMPONENT RACKS

[75] Inventor: John W. Bridges, Pflugerville, Tex.

[73] Assignee: Dell U.S.A., L. P., Round Rock, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/940,399

[22] Filed: Oct. 1, 1997

[51] Int. Cl.⁷ .................................................. B65D 19/44
[52] U.S. Cl. ........................ 108/55.3; 108/55.1; 206/320; 206/600; 312/265.5
[58] Field of Search ............................ 312/223.1, 257.1, 312/263, 265.5; 108/51.11, 55.1, 55.3, 55.5, 54.1, 52.1; 206/386, 600, 320, 576

[56] References Cited

U.S. PATENT DOCUMENTS

| | | |
|---|---|---|
| 1,449,374 | 3/1923 | Bonfield ............................... 206/320 X |
| 2,665,002 | 1/1954 | Baumann et al. ...................... 206/320 |
| 2,895,695 | 7/1959 | Solomon ............................. 206/320 X |
| 3,504,842 | 4/1970 | Grafslund ............................ 206/320 |
| 3,696,988 | 10/1972 | Nederveld . |
| 4,295,431 | 10/1981 | Stavlo ................................... 108/55.1 |
| 4,550,830 | 11/1985 | Shuert . |
| 4,760,922 | 8/1988 | Northgrave . |
| 4,911,084 | 3/1990 | Sato et al. .......................... 108/55.1 X |
| 5,109,986 | 5/1992 | Pruitt, Jr. . |
| 5,121,696 | 6/1992 | Harder ............................. 108/51.11 X |
| 5,127,527 | 7/1992 | Graham et al. . |
| 5,133,459 | 7/1992 | Genix . |
| 5,195,439 | 3/1993 | Harder ................................ 108/51.11 |
| 5,301,872 | 4/1994 | Tusing et al. . |
| 5,318,219 | 6/1994 | Smith . |
| 5,332,150 | 7/1994 | Poirier . |
| 5,441,154 | 8/1995 | Youell, III . |
| 5,450,962 | 9/1995 | Uitz . |
| 5,452,803 | 9/1995 | Stromberg . |
| 5,505,140 | 4/1996 | Wittman ............................. 108/55.1 X |
| 5,538,178 | 7/1996 | Zink et al. . |
| 5,762,222 | 6/1998 | Liu ..................................... 206/600 X |
| 5,787,817 | 8/1998 | Heil ................................. 108/51.11 X |
| 5,823,349 | 10/1998 | Bridges .............................. 206/386 X |
| 5,862,917 | 1/1999 | Noble et al. ........................... 206/600 |
| 5,911,179 | 6/1999 | Spiczka ............................... 108/51.11 |

FOREIGN PATENT DOCUMENTS

| | | | |
|---|---|---|---|
| 4118522 | 12/1992 | Germany .............................. 108/55.3 |
| 713655 | 9/1966 | Italy ....................................... 206/320 |
| 87891 | 2/1978 | Japan . |

Primary Examiner—Peter M. Cuomo
Assistant Examiner—Hanh V. Tran
Attorney, Agent, or Firm—Haynes and Boone, LLP

[57] ABSTRACT

A packaging assembly for computer cabinets includes a base having a support surface, a pallet on one side of the support surface and a support guide on the other side of the support surface. A computer cabinet is mounted on the support surface and secured to the support guide. A two-piece cover is mounted over the cabinet and secured to the base. The two pieces of the cover are secured together by removable connectors. A cap is removably mounted on an end of the cover opposite the base and secured to the cover by additional ones of the removable connectors.

12 Claims, 7 Drawing Sheets

PACKAGING APPARATUS AND METHOD FOR COMPUTER COMPONENT RACKS

BACKGROUND

The disclosures herein relate generally to computer systems and more particularly to packaging protection for the shipment of component racks used for mounting servers for mainframe applications.

Component racks are used to store components of computer systems in a centralized location. The racks are tall metal cabinets with trays for supporting components, i.e., servers including, for example, a pod system, a monitor switch box, an uninterrupted power supply, etc. The racks are typically mounted on wheels and include an access door for providing access to the components. The racks are beneficial for cable management, for centralizing a stack of components and for cosmetic reasons. A computer room may include several such racks standing side-by-side. The cables communicate the components with work stations and personal computers such that the rack and its components are the hub of a local area network (LAN).

When the racks are shipped from a vendor, they are typically covered in plastic to protect from abrasion, packaged in close fitting corrugated sleeves, and mounted on a base. The base is stacked on a pallet and banding is used to secure the sleeve and base on the pallet. Several problems arise from this type of packaging. The bases are usually not attached to the pallet so they sometimes shift on the pallet. Nylon banding is sometimes used, but will stretch and permit such shifting. Metal banding can be used, but may damage the rack. Thus, present vendor packaging does not meet some suppliers' standards.

Removal of the corrugated sleeve presents problems. First, the sleeve is close fitting and when a cutting knife is used to slit the corrugated sleeve, it may scratch the rack. If it is decided to lift the sleeve off rather than slitting, the lifting must be done in an area with a high ceiling since the racks are about eight feet high. This requires a 16-foot ceiling to lift the sleeve up and remove it from the rack.

Another problem is that the rack bottom, including the wheels, is set into a square frame base which must be removed. This requires lifting or tilting the rack to remove the base and must be accomplished by two people. Furthermore, since the racks may be purchased by system suppliers for installing trays, cables, and the like and then re-shipped to the system user, the rack must be repackaged. Therefore, if the corrugated sleeve has been slit and thus destroyed, a new container must be provided. Even if the corrugated sleeve has not been destroyed, a two-person operation is required, especially since the trays and cables have added weight to the rack. Finally, the same problems incurred in the above-described re-shipping will be experienced in the event the rack has to be repackaged to be returned by the user.

Therefore, what is needed is an apparatus and method of packaging the racks on a stable base with an easily applied and removable packaging scheme which is durable, protective and can be managed by a single individual, if necessary. The packaging also needs to be removable without being destroyed so that, if necessary for re-shipping or return, the rack may be re-packaged in the original packaging material.

SUMMARY

One embodiment, accordingly, provides an apparatus and method of packaging racks in a reusable container which is easy to pack and unpack by a single individual. To this end, a packaging assembly comprises a base including a support surface, a pallet attached to a first side of the support surface and a support guide attached to a second side of the support surface. A cover is removably mounted on the base. The cover includes a first part and a second part. Openings in the first part can be aligned with openings in the second part. A plurality of removable connectors in the aligned openings secure the first and second parts together.

A principal advantage of this embodiment is that the packaging does not have to be destroyed or damaged to be removed and can be applied and removed by a single individual. Also, no additional support material such as banding is required to stabilize the package on the palletized base.

DETAILED DESCRIPTION OF THE PREFERRED EMBODIMENT

Figure 1:
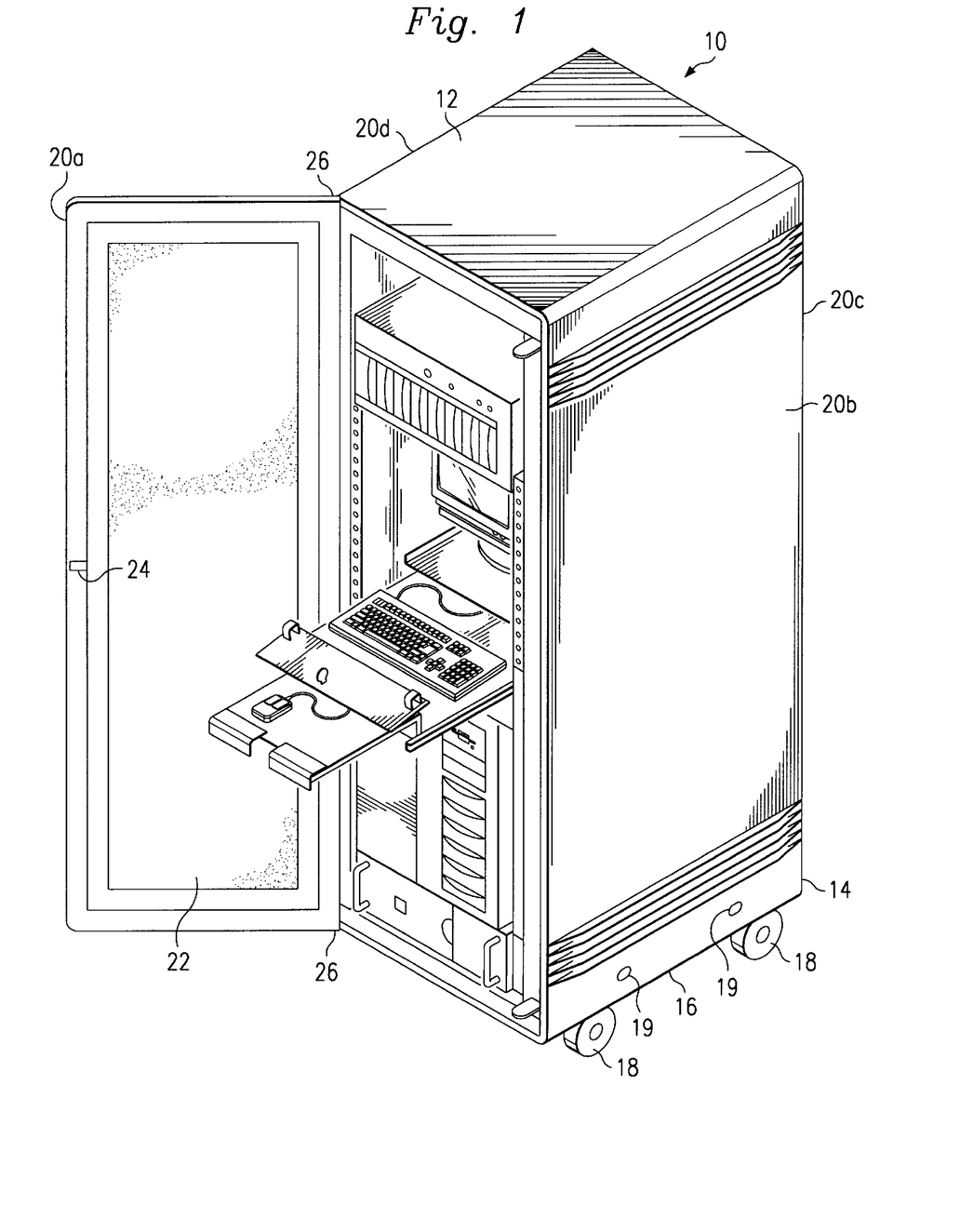
FIG. 1 is an isometric view illustrating an embodiment of a component rack.

A component rack used to store components of computer systems is generally designated 10 in FIG. 1, and includes a top end 12, a bottom end 14 including a wheel carriage base 16 having a plurality of wheels 18 mounted thereon and threaded apertures 19 provided therein. The shape of rack 10 forms a generally rectangular cabinet and includes four sides 20a–d, one of the sides 20a including door 22 having a latch 24 and hinges at 26 for opening to permit access to an interior of the rack where the components are stacked.

Figure 2:
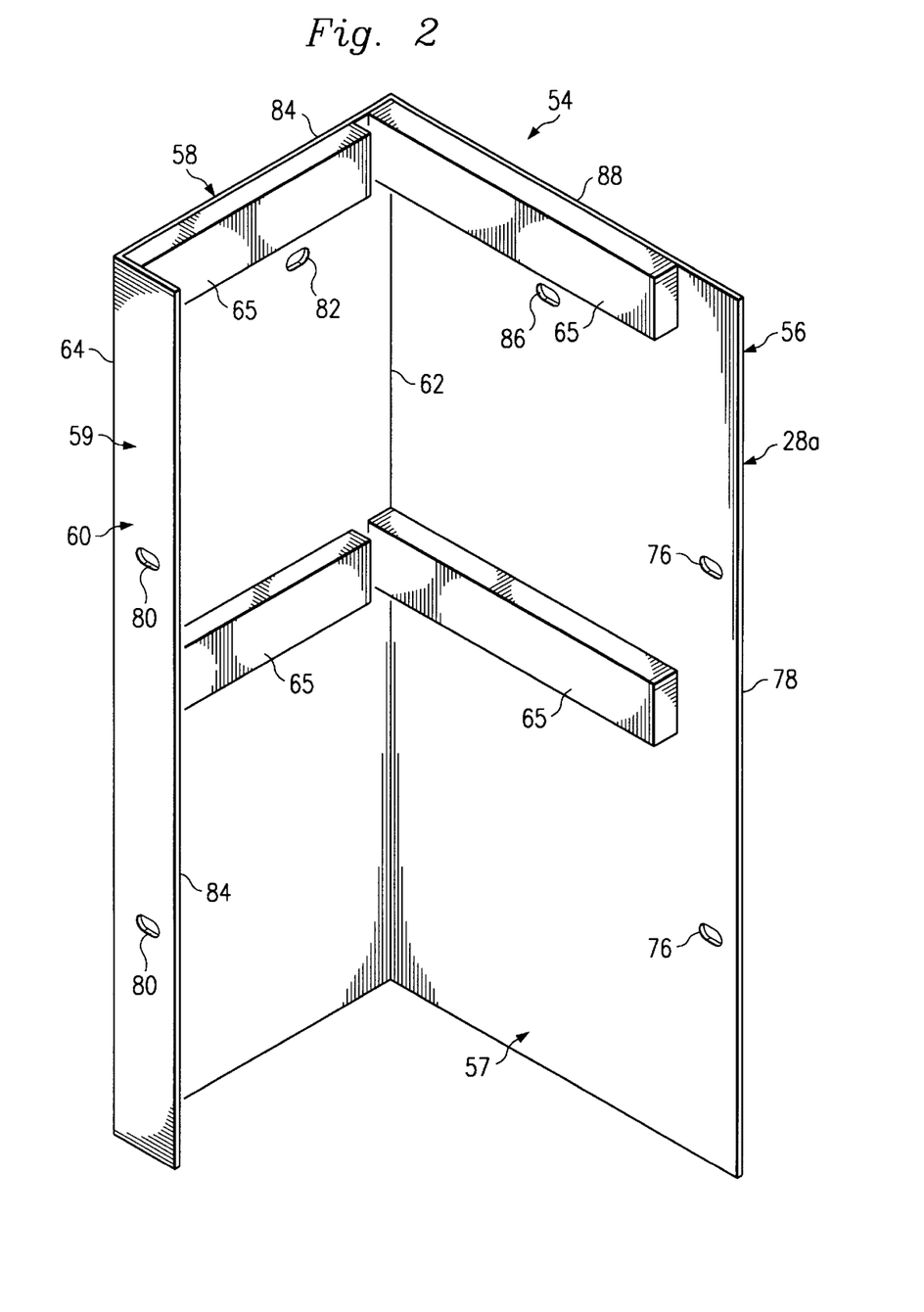
FIG. 2 is an isometric view illustrating an embodiment of one-half of a cover.
Figure 3:
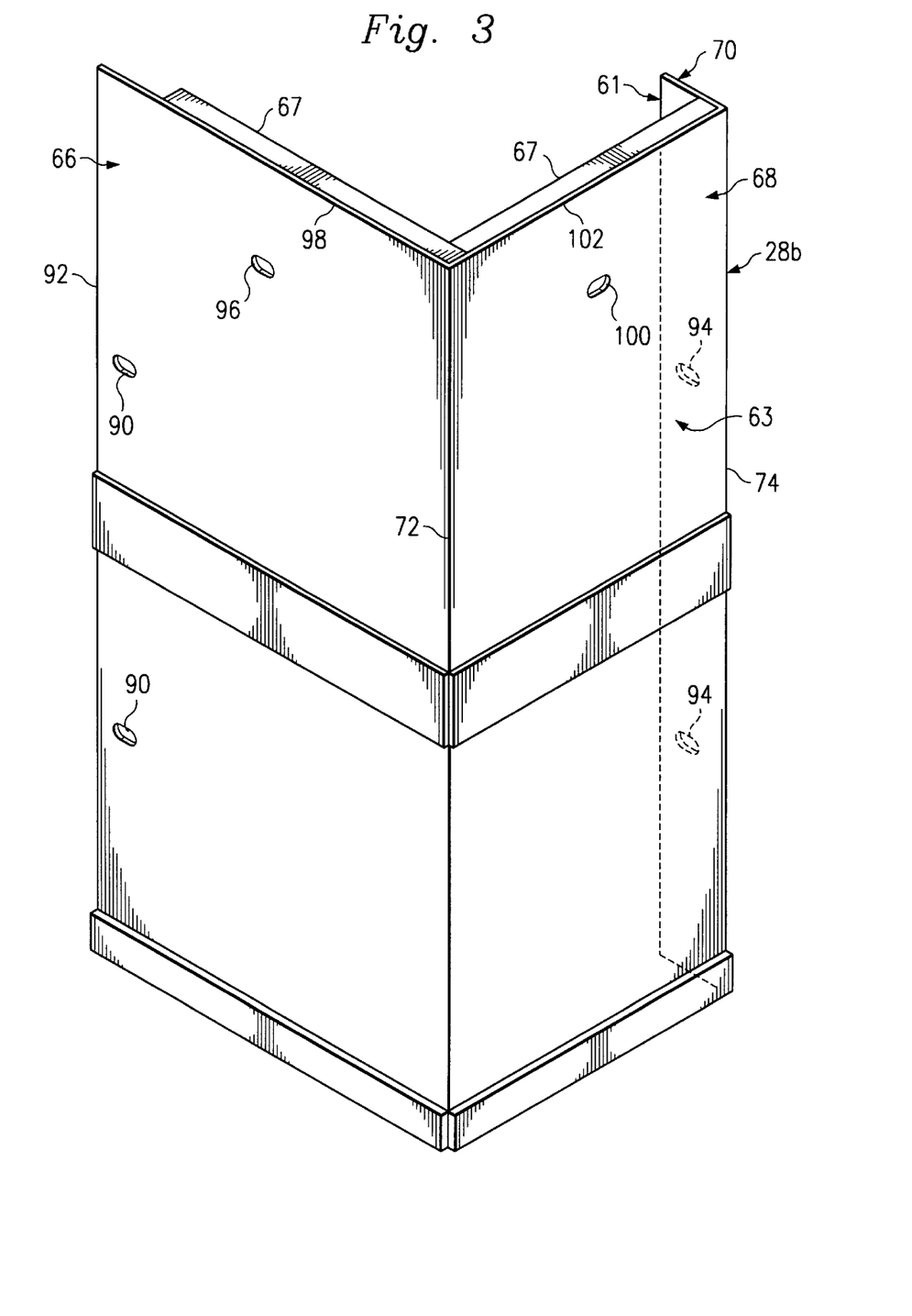
FIG. 3 is an isometric view illustrating an embodiment of the other half of the cover.

A cover, FIG. 2, is provided to be mounted on a base discussed below, and includes a pair of like parts 28a and 28b, FIG. 3. Part 28a, FIG. 2, is a continuous sheet of corrugated material including an interior surface 57 and an exterior surface 59 and having a first panel 56, a second panel 58, and a flap 60. A substantially right angle fold 62 separates panels 56, 58 and another substantially right angle fold 64 separates panel 58 and flap 60. A pair of spaced apart abrasion resistant strips 65, preferably of a foam material, are attached to each of the panels 56, 58 to extend along interior surface 57. Part 28b, FIG. 3, is also a continuous sheet of corrugated material including an interior surface 61 and an exterior surface 63 and having a first panel 66, a second panel 68, and a flap 70. A substantially right angle fold 72 separates panels 66, 68, and another substantially right angle fold 74 separates panel 68 and flap 70. A pair of spaced apart abrasion resistant strips 67, partially shown, like strips 65, are attached to panels 66, 68 to extend along interior surface 61.

Each part 28a, 28b includes a plurality of like openings formed therein. Part 28a, FIG. 2, includes openings 76 along an edge 78 of panel 56, openings 80 in flap 60, an opening 82 along an edge 84 of panel 58 and an opening 86 along an edge 88 of panel 56. Part 28b, FIG. 3, includes openings 90 along an edge 92 of panel 66, openings 94 in flap 70 which are alignable with openings 80 in flap 60, an opening 96 along an edge 98 of panel 66, and an opening 100 along an edge 102 of panel 68.

Figure 3A:
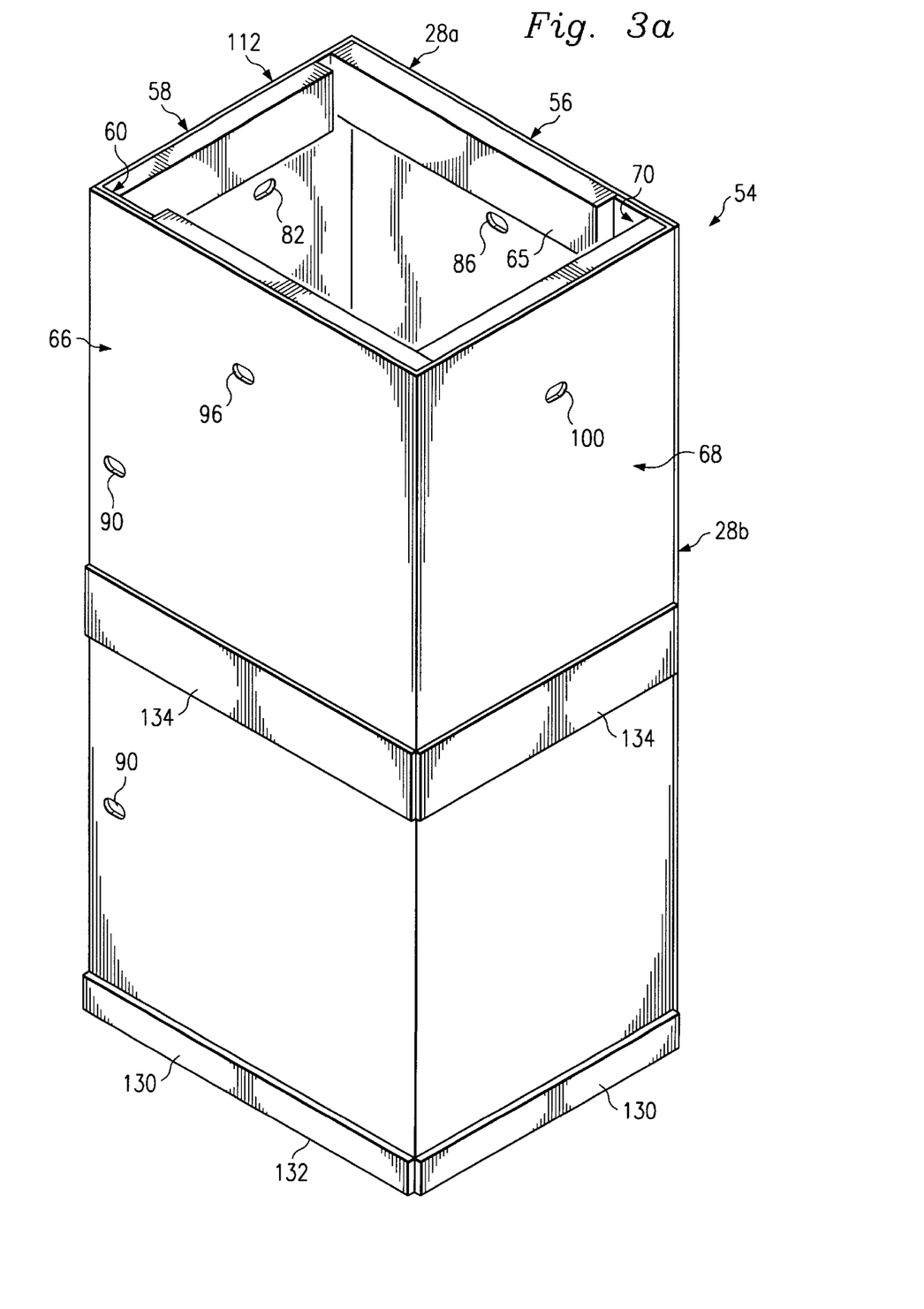
FIG. 3a is an isometric view illustrating an embodiment of the assembled cover halves.

When the parts 28a, 28b are assembled, FIG. 3a, they form a substantially rectangular cover or sleeve 54 for covering rack 10. Panel 66 of part 28b overlaps with flap 60 of part 28a so that openings 90 are aligned with openings 80 (not visible in FIG. 3a). Panel 56 of part 28a overlaps with flap 70 of part 28b so that openings 76, FIG. 2, are aligned with openings 94, FIG. 3. Parts 28a, 28b are held securely together by removable connectors, discussed below.

Figure 4:
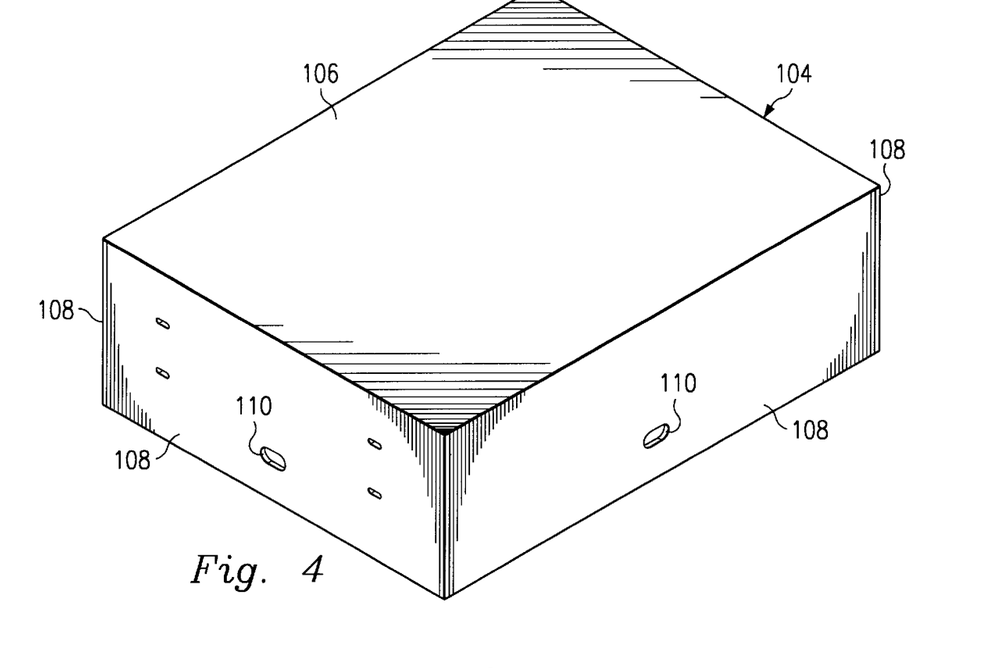
FIG. 4 is an isometric view illustrating an embodiment of a cap for the assembled cover.

A cap 104, FIG. 4, is generally rectangular and includes a top surface 106 and four side surfaces 108, only two of which are fuilly visible in FIG. 4. Each side surface 108 includes an opening 110 formed therein for receiving the removable connectors, to be discussed below. Cap 104 is sized to fit over an end 112 of cover 54, FIG. 3a, in such a manner that sides 108, FIG. 4, overlap a portion of panels 56, 58, 66, 68, FIG. 3a, of cover 54, and openings 110, FIG. 4, are aligned with openings 82, 86, 96, 100, FIG. 3a.

Figure 5:
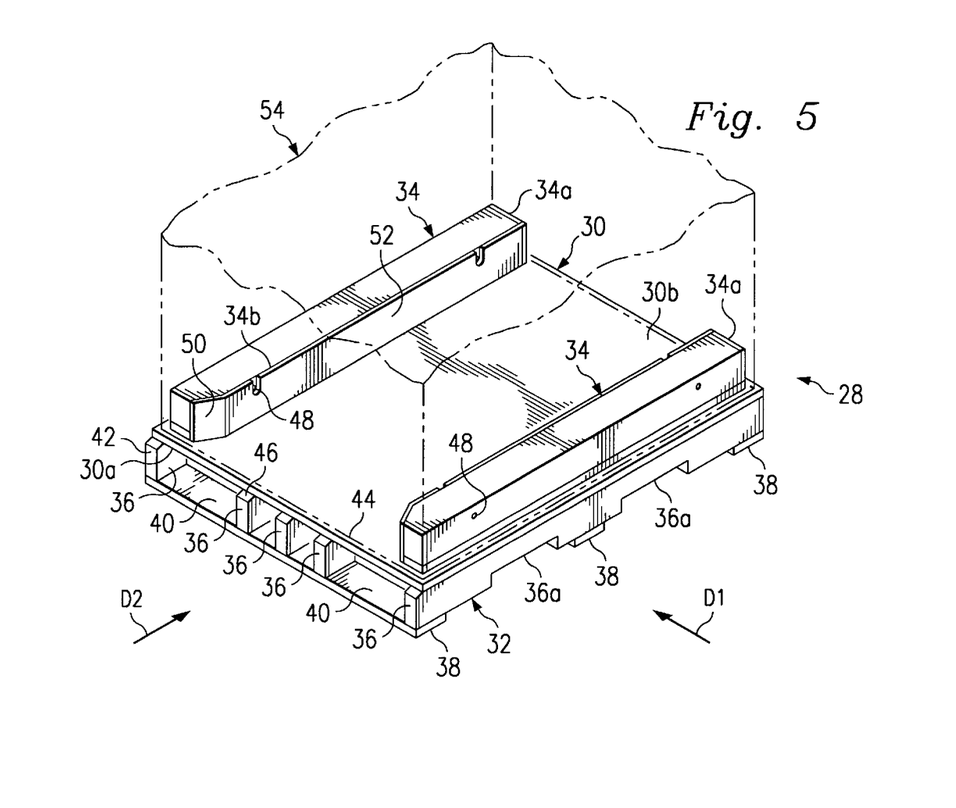
FIG. 5 is an isometric view illustrating an embodiment of a base for supporting the rack and the cover.

A base 28, FIG. 5, for supporting and packaging rack 10 includes a support surface 30, a pallet 32 attached to a first or bottom side 30a of support surface 30 and a support guide 34 attached to a second or top side 30b of support surface 30. Surface 30 is preferably a rectangular, planar, plywood sheet. Pallet 32 includes a plurality of substantially parallel, spaced apart support ribs 36 connected to support surface 30 and interconnected by a plurality of transverse members 38. Support ribs 36 are preferably wood 2×4's and include a pair of notches 36a for receiving forks of a forklift (not shown) in a first direction D1. Ribs 36 are spaced apart to form a pair of openings 40 for receiving the forks in a second direction D2. One end 42 of each rib 36 extends beyond an edge 44 of support surface 30 and is beveled at 46 for supporting a ramp to be discussed below.

Support guide 34 includes a pair of substantially parallel, spaced apart support rails 34a, preferably wood 4×4's suitably attached to top side 30b of support surface 30. Rails 34a each have a plurality of apertures 48 formed therethrough and a beveled end 50 adjacent edge 44 of support surface 30. Also, an abrasive resistant strip 52, preferably of a foam material, is attached to extend along a surface 34b of each rail 34a. Apertures 48 are aligned with threaded apertures 19 of rack 10 when rack 10 is mounted on base 28, discussed below.

Figure 6:
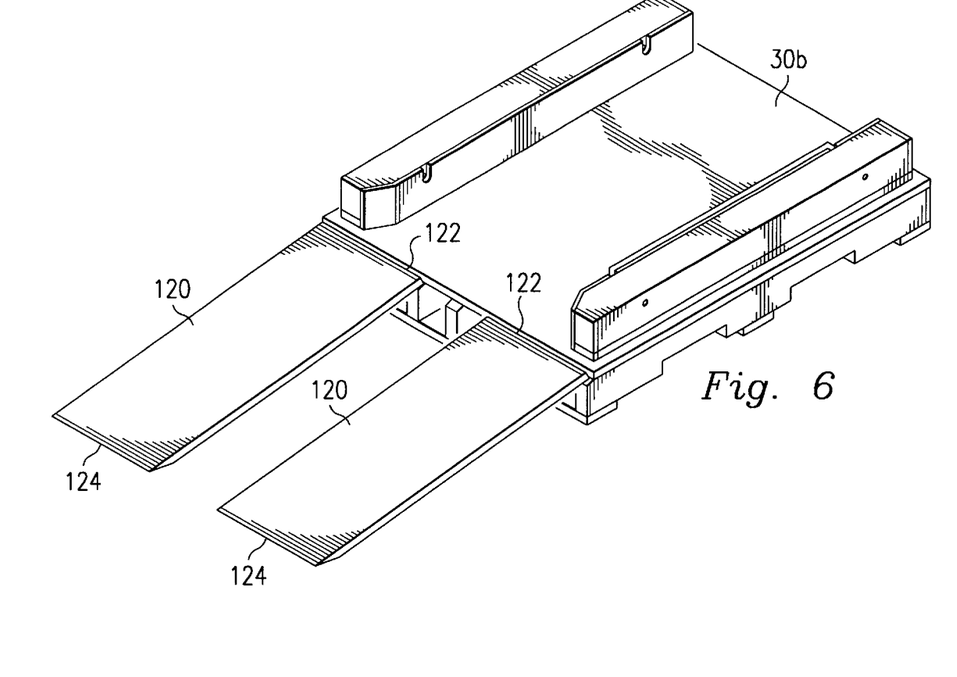
FIG. 6 is an isometric view illustrating an embodiment of the base and portable loading ramps.
Figure 7:
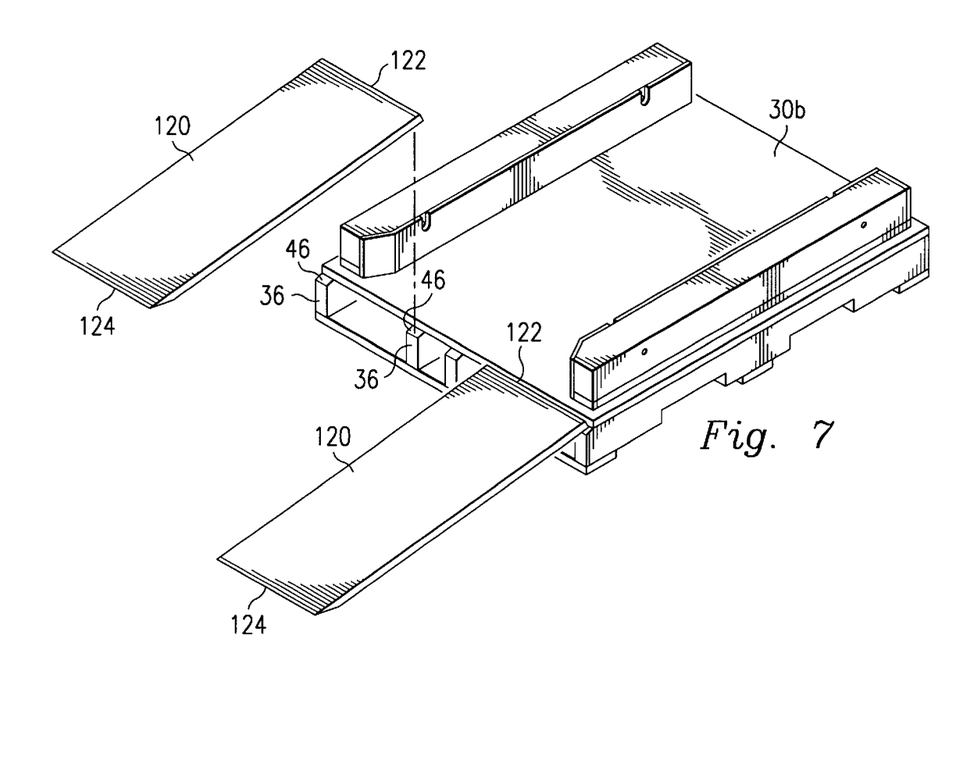
FIG. 7 is a partial isometric view illustrating an embodiment of the base and loading ramp.
Figure 8:
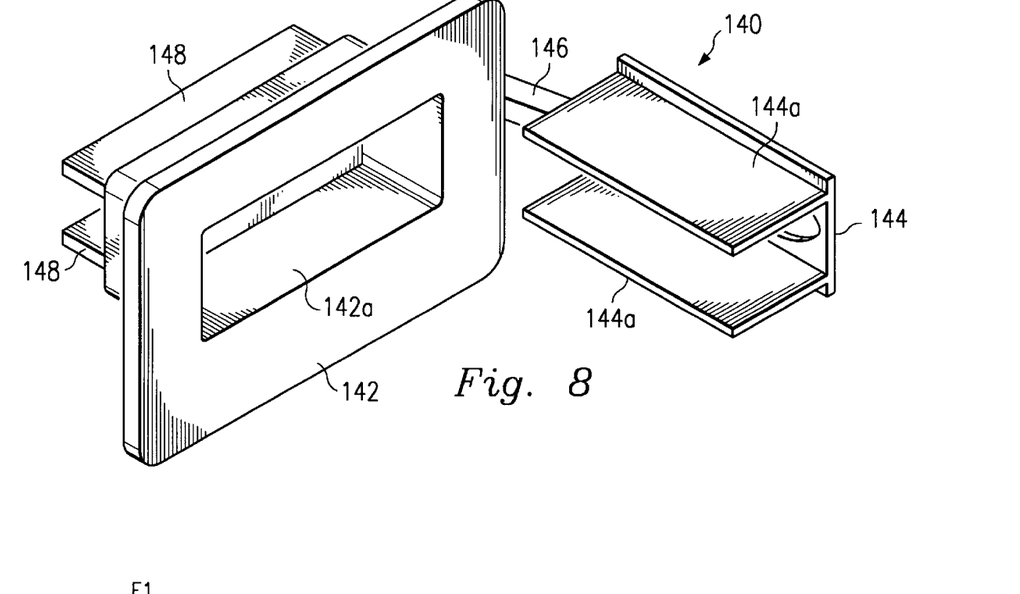
FIG. 8 is an isometric view illustrating a connector for securing the cover halves and cap together.
Figure 9:
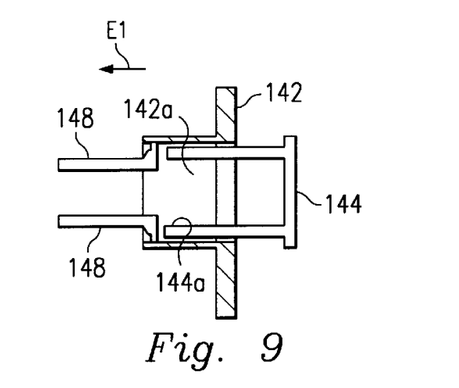
FIG. 9 is a cross-sectional side view illustrating an embodiment of the connector in an open position.
Figure 10:
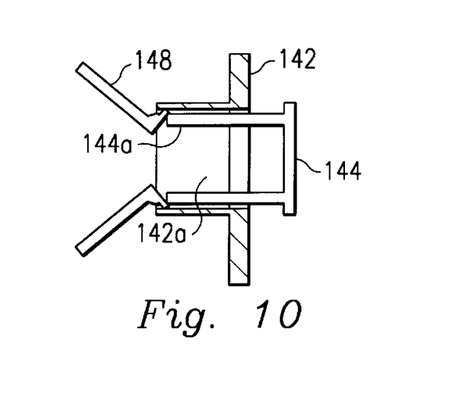
FIG. 10 is a cross-sectional side view illustrating an embodiment of the connector in partially closed position.
Figure 11:
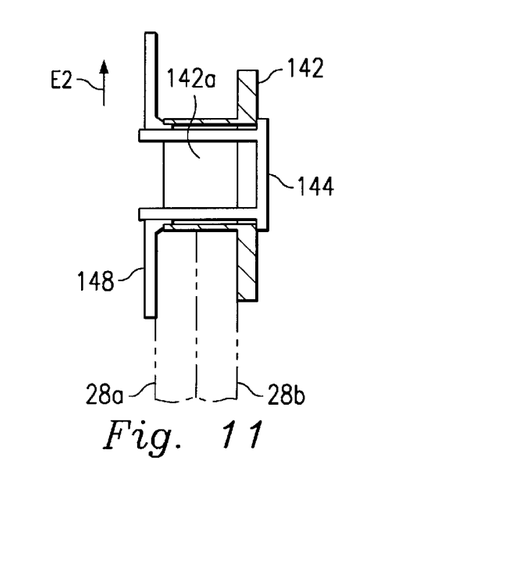
FIG. 11 is a cross-sectional side view illustrating an embodiment of the connector in a closed position.

A pair of ramps 120, FIGS. 6 and 7, may be stored on surface 30b during shipment, and positioned, for loading and unloading of rack 10, to have a first end 122 supported by beveled end 46 of ribs 36 and a second end 124 extends to a surface, i.e. a surrounding floor area (not shown), upon which base 28 rests.

A first reinforcing strip 130, FIG. 3a, preferably a wood 1×4, extends around an end 132 of cover 54. A second reinforcing strip 134, preferably a plywood ¼×6, extends around cover 54 between end 132 and opposite end 112. When cover 54 is mounted on base 28, FIG. 5, end 132, FIG. 3a, of cover 54 overlaps support guides 34, FIG. 5, and seats on surface 30b of base 28. As a result, reinforcing strip 130, FIG. 3a, is adjacent support rails 34a, FIG. 5. In this manner, suitable self tapping fasteners, i.e. sheet rock screws, not shown, may be extended through strip 130, FIG. 3a, and into each support rail 34a, FIG. 5.

A plurality of connectors 140, FIGS. 8–11, are used to secure cover halves 28a, 28b, FIGS. 2, 3 together, and to secure cap 104, FIG. 4, to cover 54, FIG. 3a. Connectors 140 are commercially available plastic connectors, product number HP-602W, identified as hand-holds, and distributed by R.W. James Packaging Corporation of San Jose, Calif. Each connector 140, FIG. 8, includes a housing portion 142 and an insert portion 144, including a pair of extensions 144a, pivotally connected to housing portion 142 by a hinge member 146 and insertable into an opening 142a in housing 142. Housing portion 142 also includes pivotal legs 148, FIG. 9, which extend therefrom in a first direction designated E1. When insert 144 is urged into opening 142a, extensions 144a of insert 144, engage pivotal legs 148 and pivot legs 148 outwardly, FIG. 10. When insert 144 is fully inserted into opening 142a, FIG. 11, legs 148 are extended in a second direction designated E2, which is perpendicular to direction E1. Also, it can be seen in FIG. 11 that, when legs 148 are extended in the direction designated E2, connector 140 can secure overlapping portions of cover halves 28a, 28b together, or can secure cap 104 to cover 54, FIGS. 3a and 4.

In operation, for packing, rack 10 is wheeled onto base 28 by use of ramps 120, which are subsequently stored under rack 10 on surface 30b of base 28 during shipping. Wheel carriage base 16 of rack 10 is secured to base 28 by the use of bolts (not shown) which extend through apertures 48 in support rails 34a and into aligned, threaded apertures 19 in rack 10. Cover halves 28a, 28b are mounted around rack 10 and joined by connectors 140 to form cover 54 on base 28. Cap 104 is mounted on end 112 of cover 54 and secured thereto by connectors 140. Fasteners (not shown) are threaded through reinforcing strip 130 at end 132 of cover 54 and threaded into support rails 34a.

For unpacking, the threaded fasteners are removed from reinforcing strips 130. Connectors 140 are removed so that cap 104 can be removed and cover halves 28a, 28b can be separated and removed from base 28. Ramps 120 may be removed from storage under rack 10 on base 28 and ends 122 placed on beveled edges 46 of base 28, with ends 124 supported on a surrounding surface, i.e. a floor. Bolts (not shown) securing rack 10 to base 28 may be removed and rack 10 may be rolled on wheels 18 down the ramps 120.

As it can be seen, the principal advantages of these embodiments are that the packaging base is stable, the packaging is removable without being damaged or destroyed. Also, the packaging is reusable. The entire packing and unpacking operation can be accomplished by a single individual. When packaged racks are stored, the plywood strip midway between top and bottom may function not only to reinforce the package, but will provide an audible cracking or tearing sound if overstressed to a point where it begins to fail.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A re-usable packaging assembly assembled and disassembled on a pallet comprising:

a base including a support surface;

the pallet attached to a first side of the support surface, and a support guide attached to a second side of the support surface;

the pallet including reinforcing members having a beveled edge adjacent to and extending beyond the support surface;

a ramp being removably attachable to the beveled edge of the reinforcing members so that the beveled edge supports the ramp adjacent the support surface;

a cover assembled and disassembled on the base, the cover including a first part and a second part including openings formed in each part, the first part including an engagement flap for overlapping connection with the second part, and the second part including an engagement flap for overlapping connection with the first part;

a cap including openings for attachment to an end of the cover opposite the base; and a plurality of re-usable connectors in the openings securing the first and second parts together and securing the cap to the cover.

2. The packaging assembly as defined in claim 1 wherein the support guide includes a pair of spaced apart support rails.

3. The packaging assembly as defined in claim 2 wherein the rails have a beveled end.

4. The packaging assembly as defined in claim 3 wherein the beveled end is adjacent the ramp.

5. The packaging assembly as defined in claim 2 wherein each of the rails include a surface having a strip of abrasion resistant material mounted thereon.

6. The packaging assembly as defined in claim 2 further comprising a first reinforcing strip attached to the cover adjacent the support rails.

7. The packaging assembly as defined in claim 6 further comprising a second reinforcing strip attached to the cover between the cap and the base.

8. The packaging assembly as defined in claim 1 wherein each of the first and second parts of the cover include packing support strips formed of abrasion resistant material.

9. The packaging assembly as defined in claim 1 wherein each part of the cover is adjacent to the support guide.

10. The packaging assembly as defined in claim 9 further comprising a first reinforcing strip attached to the cover adjacent the support guide and a second reinforcing strip attached to the cover between the cap and the base.

11. A re-usable packaging assembly assembled and disassembled on a pallet supporting a computer cabinet comprising:

a base including a support surface, a pallet attached to a first side of the support surface and a pair of support rails attached to a second side of the support surface;

the pallet including reinforcing members having a beveled edge adjacent to and extending beyond the support surface;

a ramp being removably attachable to the beveled edge of the reinforcing members so that the beveled edge supports the ramp adjacent the support surface;

a computer cabinet including a wheel carriage, the wheel carriage being between the support rails, and the cabinet being secured to the support rails;

a cover covering the cabinet and being assembled and disassembled on the base, the cover including a first part and a second part each including an engagement flap and aligned openings formed in each of the first and second parts;

a plurality of re-usable connectors in the aligned openings securing the first and second parts together; and a cap including openings for attachment to an end of the cover opposite the base and secured to the cover by additional ones of the re-usable connectors.

12. The packaging assembly as defined in claim 11, wherein the cabinet includes a plurality of threaded apertures formed therein adjacent the wheel carriage, the cabinet being secured to the support rails by threaded fasteners extending through openings formed in the rails and into the threaded apertures.

* * * * *